US006008491A

United States Patent [19]

Smentkowski et al.

[11] Patent Number: 6,008,491

[45] Date of Patent: Dec. 28, 1999

[54] TIME-OF-FLIGHT SIMS/MSRI REFLECTRON MASS ANALYZER AND METHOD

[75] Inventors: Vincent S. Smentkowski, Clifton Park, N.Y.; Dieter M. Gruen, Downers Grove; Alan R. Krauss, Naperville, both of Ill.; J. Albert Schultz, Houston, Tex.; John C. Holecek, Colorado Springs, Colo.

[73] Assignee: The United States of America as represented by the United States Department of Energy, Washington, D.C.

[21] Appl. No.: 08/953,792

[22] Filed: Oct. 15, 1997

[51] Int. Cl.[6] .............................. H01J 37/08; H01J 49/00; B01D 59/44

[52] U.S. Cl. ........................... 250/309; 250/287; 250/307

[58] Field of Search .................................... 250/309, 397, 250/251, 307, 287

[56] References Cited

U.S. PATENT DOCUMENTS

| | | | |
|---|---|---|---|
| 4,611,120 | 9/1986 | Bancroft et al. | 250/309 |
| 4,731,532 | 3/1988 | Frey et al. | 250/287 |
| 5,068,535 | 11/1991 | Rabalais | 250/309 |
| 5,087,815 | 2/1992 | Schultz et al. | 250/309 |
| 5,300,774 | 4/1994 | Buttrill | 250/287 |
| 5,347,126 | 9/1994 | Krauss et al. | 250/309 |

OTHER PUBLICATIONS

*A Novel Time of Flight Analyzer for Surface Analysis Using Secondary Ion mass Spectroscopy and Mass Spectroscopy of Recoiled Ions,* by V. S. Smentkowski, J. C. Holecek, J. S. Schultz, A. R. Krauss, and D. M. Gruen, submitted for publication in the Proceedings of the 11th International Conference on Secondary Ion Mass Spectroscopy (SIMS), Orlando, Florida, Sep. 7–12, 1997.

*Analyzer Combines MSRI and SIMS,* R&D Magazine, Sep. 1997, vol. 39, No. 10, p. 25.

*Argonne/Ionwerks Corp. Materials Technology is among 1997 R&D Winners,* Tech Transfer Highlights, vol. 8, No. 2, 1997.

*Surface Analysis of All Elements with Isotopic Resolution at High Ambient Pressures Using Ion Spectroscopic Techniques,* V. S. Smentkowski, J.C. Holecek, J.A. Schultz, A.R. Krauss, and D.M. Gruen, submitted for publication in the Proceedings of the 11th International Conference on Secondary Ion Mass Spectroscopy (SIMS), Orlando, Florida, Sep. 7–12, 1997.

(List continued on next page.)

*Primary Examiner*—Bruce C. Anderson
*Attorney, Agent, or Firm*—Daniel D. Park; Mark P. Dvorscak; William R. Moser

[57] ABSTRACT

A method and apparatus for analyzing the surface characteristics of a sample by Secondary Ion Mass Spectroscopy (SIMS) and Mass Spectroscopy of Recoiled Ions (MSRI) is provided. The method includes detecting back scattered primary ions, low energy ejected species, and high energy ejected species by ion beam surface analysis techniques comprising positioning a ToF SIMS/MSRI mass analyzer at a predetermined angle θ, where θ is the angle between the horizontal axis of the mass analyzer and the undeflected primary ion beam line, and applying a specific voltage to the back ring of the analyzer. Preferably, θ is less than or equal to about 120° and, more preferably, equal to 74°. For positive ion analysis, the extractor, lens, and front ring of the reflectron are set at negative high voltages (−HV). The back ring of the reflectron is set at greater than about +700V for MSRI measurements and between the range of about +15 V and about +50V for SIMS measurements. The method further comprises inverting the polarity of the potentials applied to the extractor, lens, front ring, and back ring to obtain negative ion SIMS and/or MSRI data.

23 Claims, 5 Drawing Sheets

OTHER PUBLICATIONS

Abstract: *A Novel Reflectron Time of Flight Analyzer for Surface Analysis using Secondary Ion Mass Spectroscopy and Mass Spectroscopy of Recoiled Ions,* by V. S. Smentkowski, A. R. Schultz, D. M. Gruen, J. C. Holecek, and J. A. Schultz, 43rd National Symposium, American Vacuum Society, Philadelphia, Pennsylvania, Oct. 14–18, 1996.

*Novel TOF Technology for Surface Analysis Unveiled,* Mary Fitzpatrick, R&D Daily, AVS Symposium, appearing on Oct. 15, 1996.

Abstract: *A Time–of–Flight Analyzer for Surface Analysis Using Secondary Ion Mass Spectroscopy and Mass Spectroscopy of Recoiled Ions,* V.S. Smentkowski, J.C. Holecek, J.A. Schultz, A.R. Krauss, and D.M. Gruen, Book of Abstracts, Post–ionization Techniques in Surface Analysis (PITSA) 5, Oct. 7 to 11, 1996.

TIME-OF-FLIGHT SIMS/MSRI REFLECTRON MASS ANALYZER AND METHOD

CONTRACTUAL ORIGIN OF THE INVENTION

The United States Government has rights in this invention pursuant to Contract Number W-3 1-109-ENG-38 between the United States Government and The University of Chicago, as operator of Argonne National Laboratory.

TECHNICAL FIELD

The present invention relates to method and apparatus for analyzing the surface characteristics of a sample by Secondary Ion Mass Spectroscopy (SIMS) and Mass Spectroscopy of Recoiled Ions (MSRI).

BACKGROUND OF INVENTION

Mass spectrometry is an analytical method for quantitatively and qualitatively determining the chemical composition and molecular structure of sample materials. Mass spectrometers are generally comprised of an ion source, a mass analyzer, and a detector. In operation, the sample is positioned in an evacuated area containing the ion source and an ion beam comprised of primary ions is directed at the sample surface. The primary ions collide with the surface species of the sample in accordance with classical collision kinematics, resulting in the back scattering of the primary ions and/or the ejection of surface species from the sample surface. Depending on the angle of incidence, mass of the primary ion beam, and energy of the primary ion beam, the ejected surface species may be comprised of elemental ions, neutral atoms, and/or molecular fragments. The back scattered primary ions and/or ejected species are focused and separated in the mass analyzer and detected by the detector. The energies (velocities) of the back scattered primary ions and ejected surface species correlate with the mass of the surface species and thus are used to identify the chemical composition and structure of the sample surface.

One type of mass analyzer is a linear time-of-flight (ToF) mass analyzer which determines the mass spectra of the surface species by measuring the times for the back scattered primary ions and the ejected surface species to traverse a field-free drift region. The field-free drift region is generally bounded by a drawout grid and an exit grid, which are often at ground potential. The primary back scattered ions and ejected species pass through the drift region and their times of flight are measured by the detector. Mass separation occurs because ions with different masses reach the detector at different times. Pulsing the ion beam, as opposed to directing a continuous beam of ions to the sample surface, allows for a discrete measurement of the back scattered primary ions and the ejected surface species at the detector.

As the primary back scattered ions and ejected species have different initial kinetic energies upon leaving the sample surface, a reflectron is typically used in conjunction with the ToF mass analyzer. The reflectron compensates for the initial kinetic energy distributions by providing a retarding electrical field that reverses the trajectories of the traveling primary ions and ejected species to negate the effects of the uneven kinetic energy distribution and differing velocities. As the ions enter the reflectron, ions with higher kinetic energy and velocity penetrate farther into the reflectron than those ions with lower kinetic energy and velocity, thus traveling a longer path to their focal point. In this way, primary ions and ejected species having the same mass but different initial kinetic energies arrive at the detector simultaneously. The detector counts the incidence of the ejected species. Thus, ToF analyzers including reflectrons can provide a mass spectrum for ejected species over an entire mass range with improved mass resolution verses a linear ToF analyzer.

Ion Scattering Spectroscopy (ISS) is a mass spectroscopy method that measures only the energies of the back scattered primary ions. The primary ion beam strikes the sample surface at about normal incidence, and the back scattered primary ions lose energy according to classical two-body collision kinematics. The surface species are identified by their mass, which is calculated from the arrival time (kinetic energy and velocity) of the back scattered primary ions. The back scattered ion signal is believed to be representative of the composition of the uppermost atomic layer of the sample. Using ISS, all elements heavier than the primary beam can be detected.

Secondary Ion Mass Spectroscopy (SIMS) is a mass spectroscopy method that detects surface species ejected by multiple collisions, also referred to as multiply recoiled or indirect ions, initiated by the incidence of the primary ions from the ion beam on the sample surface. FIG. 1 schematically illustrates SIMS, where the incident primary beam induces a collision cascade in the surface region, which dissipates energy to the lattice atoms through a number of successive biparticle collisions. As some of the cascade returns to the surface, molecular fragments and elemental species are ejected. The ejected surface species have low kinetic energies of less than 20 eV.

Direct Recoil Spectroscopy (DRS), as shown schematically in FIG. 2, is a mass spectroscopy method for measuring the kinetic energies of direct recoil surface species, which are surface species ejected by a single binary collision between a primary ion of the ion beam and a surface atom. DRS directs the primary beam at the sample surface at an angle (grazing incidence), such that binary collisions between the primary ions and the surface species occur, resulting in the direct ejection of surface species in a forward scattering direction, rather than in a collision cascade within the surface region. The energy of the DRS collision causes complete molecular decomposition, and only elemental species (ions and neutrals) are ejected and detected. In contrast to SIMS, the energy of the DRS ejected species is high (200 eV to 6 keV), depending on the scattering geometry, the recoiled mass, the primary ion mass, and the primary ion energy. Mass Spectroscopy of Recoiled Ions (MSRI) is a DRS method that does not measure neutrals, but only the elemental ions, resulting in a higher resolution energy peak for the detected elements.

The method and geometry of ion beam surface analysis (ISS, SIMS, DRS, and MSRI), as shown in FIG. 3, generally consists of directing an ion beam of mass $M_1$ and kinetic energy $E_0$ at the surface of the sample, which is comprised of atoms with mass $M_2$, and detecting the back scattered primary ions with energy $E_1$ (ISS), multiply recoiled surface species with energy of about 20 eV (SIMS), and/or direct recoil surface species (DRS/MSRI) with energy $E_2$. For primary ions in the approximate range of between 1 keV and 100 keV, the primary ion-target atom collisions are adequately described by two-body classical collision dynamics. The kinetic energy $E_1$ of the scattered primary ions is given by $$E_1=(1+a)^{-2}[\cos q_1 \pm (a^2-\sin^2 q_1)^{1/2}]^2$$

provided $M_2>M_1$. The kinetic energy $E_2$ of the recoil surface species is $$E_2=4a(1+a)^{-2}\cos^2\theta$$

where $a=M_2/M_1$ and $q_1$ and θ are the scattering and recoil angles, respectively. As the mass and the velocity of the primary ions of the ion beam are known, and the velocity of the back scattered primary ions and/or ejected species is measurable, the mass of the back scattered primary ions and/or ejected species is determinable from the relationship $E=\frac{1}{2}mv^2$.

ToF SIMS instruments measure the times for the primary ions and low energy surface species ejected by the collision cascade to travel through the field-free region. The reflectron analyzer used in high resolution ToF SIMS instruments is positioned with the horizontal axis of the field free region close to the sample surface normal, such that the low energy SIMS ions are ejected into the analyzer. Advantageously, SIMS instruments detect and measure molecular ions and molecular fragments, as well as elemental species, providing valuable qualitative analysis of the chemical composition of the surface. Analysis of the mass data is complicated, however, when molecular species have the same mass as elemental ions (isobaric interferences). For example, $C_xH_y$ molecular fragments prevent the positive identification of N (vs. $CH_2$), O (vs. $CH_4$), Al (vs. $C_2H_3$), Cr (vs. $C_4H_4$), and Fe (vs. $C_4H_8$), and, more significantly , especially for the semi-conductor industry, the presence of CO and Si are indistinguishable, as well as $Fe^{2+}$ and Si. Charge transfer and neutralization further complicates SIMS analysis. During the ejection of ions from the surface of the sample, a transfer of charge occurs between the surface and the ions, resulting in the neutralization of a portion of the ionic species. The probability of neutralization depends on the local electron density of the surface in the region from which the ion originated and the velocity of the ion as it exits the surface. In SIMS, ions are ejected from the surface with low velocities and kinetic energies, and the probability of ion survival varies by many orders of magnitude, depending on the element being ejected and the oxidation state of the surface. Thus, SIMS instruments measure a small fraction (less than 1%) of a large number surface atoms.

ToF MSRI instruments measure the times for the primary ions and high energy surface species ejected by a single binary collision to travel through the field-free region. MSRI instruments do not measure neutrals, but only the elemental ions, resulting in a higher resolution energy peak for the detected elements than DRS. In addition, MSRI instruments detect all elements with isotopic resolution, including low mass elements (i.e. molecular hydrogen and atomic deuterium) which are indistinguishable by the SIMS method. Since the recoiled MSRI ions have a much larger velocity than the SIMS ions, the MSRI ions are much less subject to neutralization by charge exchange with the surface, and, therefore, MSRI measures a large ion fraction of the ejected species, however, the number of ejected species is small.

Currently, monitoring the surface properties of thin films, especially during the growth of thin films, is critical in technologies involving diamond films, multi-component semiconductor films, and metal and metal oxide films. Thin films are grown under specific conditions, including a low vacuum, high pressure environment. For example, typical conditions for diamond growth include a hydrogen atmosphere, heating, and the allowance for the positioning of film deposition and other instruments. Key factors influencing the surface properties of thin films are the deposition rates of various species, migration of materials at the surface, differences between surface and sub-surface composition, thickness and uniformity of the film, and nucleation of growth sites. For multi-component films, and particularly for multi-component films grown in an atmosphere of oxygen or nitrogen, precise control of the film properties depends on the ability to monitor the growth process as it occurs.

Mass spectroscopy techniques employing low energy pulsed ion beams (less than or equal to 10 keV) are capable of providing a wide range of information directly relevant to the growth of thin films. However, ion beam methods have not been widely used for monitoring thin film growth, because the existing commercial designs and instrumentation are largely unsuitable for the application. For example, in order to characterize the process occurring at the surface of a growing film, the instrument must probe the first few atomic layers and identify the uppermost monolayer where the growth occurs. Most surface analysis methods, however, are unsuitable as in-situ monitors of thin film deposition processes because they require ultra-high vacuum environments, physically obstruct the deposition process, take too long to acquire data, and/or cause significant damage to the film.

One approach for adapting DRS/MSRI instruments to thin film growth applications has been to equip the ion sources and detectors with differential pumping apertures which terminate close to the sample surface, such that the high pressure path traveled by the beam is small. The high velocity of the recoiled MSRI elemental ions allows for surface analysis under high pressure conditions, if both the primary ion source and the detector(s) are differentially pumped. The ability to measure the surface composition with isotopic resolution at high sample pressures makes MSRI suitable for in-situ, real-time monitoring and process control of a variety of thin film deposition processes. SIMS analysis at high pressures, however, is not feasible due to the low velocity of the SIMS ions.

SIMS instruments and MSRI instruments provide complimentary information regarding the chemical composition and structure of the surface of a sample. SIMS provides information about the molecular and elemental species present on the surface of the sample, however, with some complexity regarding the analysis. MSRI provides more quantitative information about elemental species only, and, when used in conjunction with SIMS, can simplify the SIMS analysis. Although there are numerous ToF SIMS instruments utilizing reflectron analyzers, such instruments are not capable of MSRI analysis because MSRI ions have significantly greater energy than SIMS ions and available SIMS ToF instruments are not capable of operating at the high voltages needed for MSRI analysis. Also, the detection of MSRI ions requires an experimental geometry that is different than the geometry used in SIMS ToF measurements.

A need exists in the art for an instrument capable of performing both SIMS and MSRI measurements in a thin film growth environment. The instrument must provide a diverse range of information (composition, structure, growth), be compatible with process conditions (temperature, pressure), be non-destructive to the sample surface, operate in real time, and not interfere with the surface deposition instruments.

The present invention is a ToF SIMS/MSRI reflectron mass analyzer and method that is capable of providing mass spectrum of isotopic resolution for all elements, including hydrogen and helium, using the techniques of both SIMS and MSRI. The use of a single mass analyzer to selectively obtain pure SIMS and/or MSRI spectra is unique and provides valuable, complimentary surface information for sample materials, including thin films.

Therefore, in view of the above, a basic object of the present invention is to provide a ToF SIMS/MSRI reflectron mass analyzer and method capable of performing surface analysis on thin films using both SIMS and MSRI techniques. In addition, MSRI analysis may be performed during thin film growth, in a low vacuum, high pressure environment.

A further object of this invention is to provide a ToF SIMS/MSRI reflectron mass analyzer and method of using a reflectron time of flight analyzer having a critical, optimal geometry, and adjustable reflectron voltages and extraction optics, such that SIMS measurements and MSRI measurements may be accomplished with the same instrument.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of instrumentation and combinations particularly pointed out in the appended claims.

BRIEF SUMMARY OF THE INVENTION

This invention relates to a method and apparatus for analyzing the surface characteristics of a sample by Secondary Ion Mass Spectroscopy (SIMS) and Mass Spectroscopy of Recoiled Ions (MSRI).

Briefly, the present apparatus is a time-of-flight (ToF) SIMS/MSRI reflectron mass analyzer comprised of a ToF mass analyzer and a reflectron positioned at a unique geometry with respect to the sample and ion beam, such that SIMS and MSRI measurements are both alternatively feasible. The ToF mass analyzer is a field-free float tube having an extractor/pumping aperture and lens assembly at the first end for receiving and focusing the back scattered primary ions and ejected species, and a reflectron at the opposing end for separating the back scattered primary ions and ejected species according to their masses. An ion detector and a line-of-sight neutral detector are provided for simultaneously detecting neutral species at the same angle required for measuring ion species. The ToF SIMS/MSRI reflectron mass analyzer is enclosed in a vacuum chamber and connected to a second vacuum chamber containing the sample, such that the extractor/pumping aperture is in close proximity to the sample surface.

Importantly, the apparatus is positioned with respect to the sample surface and ion beam source at a predetermined angle, such that both SIMS and MSRI mass spectroscopy techniques may be used alternatively to characterize the sample surface. The reflectron voltages and extraction optics also allow for alternative SIMS and MSRI measurements. For example, the quality and quantification of MSRI data is significantly increased by ion extraction involving focusing the ions into the reflectron analyzer using a high voltage lens and biasing the field free drift region of the reflectron analyzer to large potentials.

The present method includes detecting back scattered primary ions, low energy ejected species, and high energy ejected species by ion beam surface analysis techniques comprising positioning the ToF SIMS/MSRI mass analyzer at a predetermined angle $\theta$, where $\theta$ is the angle between the horizontal axis of the mass analyzer and the undeflected primary ion beam line, and manipulating the voltage of the back ring of the analyzer. According to the present method, $\theta$ is less than or equal to 120° degrees, and preferably equal to about 74°. As $\theta$ is increased (for example, above 80°), fewer direct recoil ions (MSRI ions) are extracted into the analyzer and more indirect recoil ions and molecular fragments (SIMS ions) are extracted into the analyzer. For positive ion analysis, the extractor, lens, and front ring of the reflectron are set at negative high voltages (–HV). The back ring of the reflectron is set at greater than about +700V for MSRI measurements, depending on the scattering geometry, the primary ion mass, and the primary ion energy, and between the range of about +15 V and about +50V for SIMS measurements. The method further comprises inverting the polarity of the potentials applied to the extractor, lens, front ring, and back ring to obtain negative ion SIMS and/or MSRI data.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DETAILED DESCRIPTION OF THE INVENTION

The present invention relates to method and apparatus for analyzing the surface characteristics of a sample by Secondary Ion Mass Spectroscopy (SIMS) and Mass Spectroscopy of Recoiled Ions (MSRI).

Figure 4:
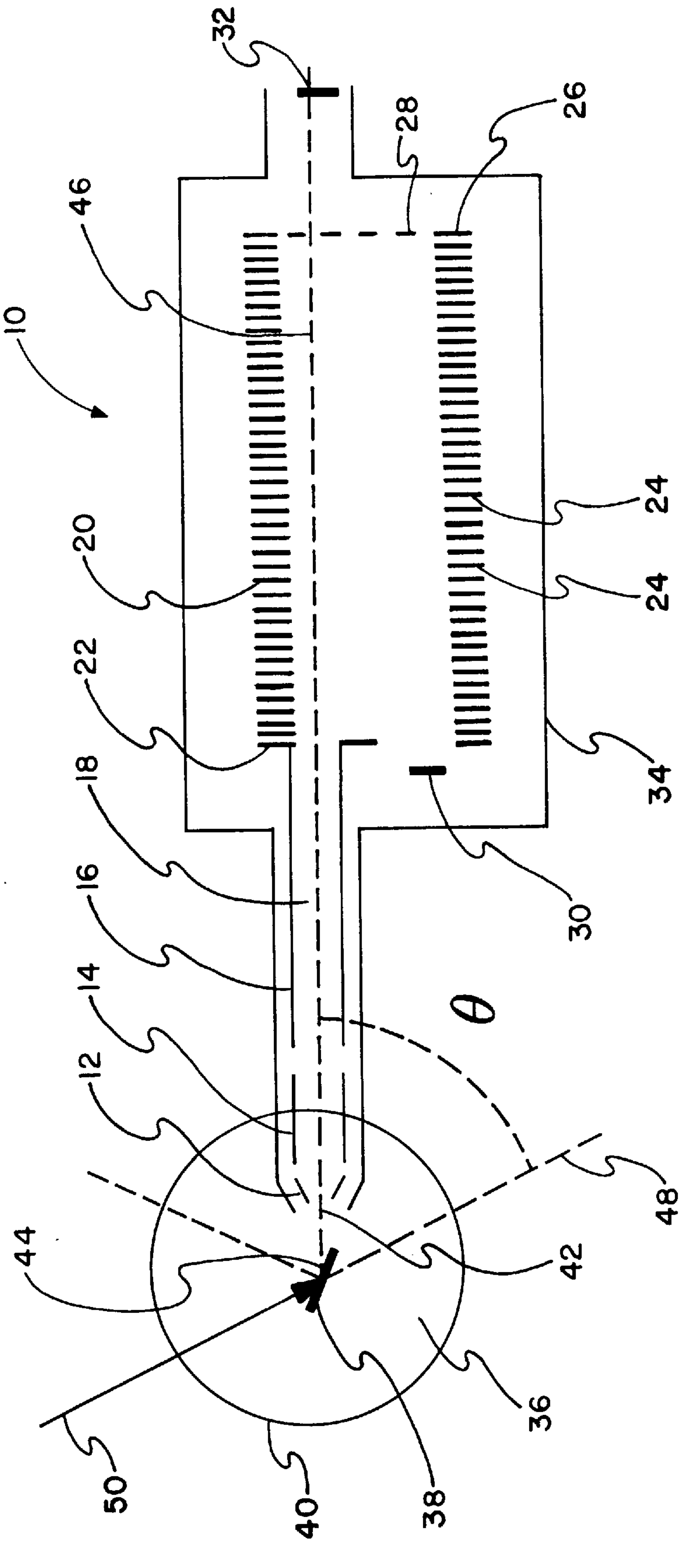
FIG. 4 is a cross-section view of the SIMS/MSRI reflectron ToF mass analyzer.

The present apparatus is a SIMS/MSRI time-of-flight (ToF) reflectron mass analyzer 10, as shown in FIG. 4. The apparatus has six major components: an ion extractor/pumping aperture 12; a lens assembly 14; a high voltage float 16 comprised of a field free drift region 18; a multiple or forty-three ring reflectron 20 having a front ring 22, multiple central rings 24, a back ring 26, and and the corresponding sample surface normal are; an ion detector 30; and a line-of-sight (neutral) detector 32. The vacuum chamber 34 containing apparatus 10 is connected to sample vacuum chamber 40, which contains the sample 38 to be analyzed, such that the extractor/pumping aperture 12 is in close proximity to the sample surface 44. The apparatus has a horizontal axis (the horizontal axis of the high voltage float tube). The analyzer is thus comprised of an extractor 12 having an aperture 42 for extracting deflected primary ion species and ejected surface species into the analyzer 10, the ejected sample species including an ion fraction and a neutral fraction, a lens assembly 14 for focusing the extracted sample species, a field-free float tube 16, a reflectron 20 having a front ring 22, at least one central ring 24, a back ring 26, and a back grid 28, whereby the reflectron separates the ion fraction of the extracted surface species by mass by reversing the trajectories of the ion fraction, an ion detector 30 intersecting the reversed trajectories of the ion fraction for detecting the times of flight of the ion fraction within the analyzer, and a neutral detector 32 positioned along the horizontal axis 46 of the analyzer for detecting the times of flight of the neutral fraction of the extracted species within the analyzer.

The extractor/differential pumping aperture 12 allows for differential pumping of the mass analyzer 10, whereby the vacuum chamber 34 containing the mass analyzer 10 is pumped separately from the higher pressure region 36 containing the sample 38 in the sample chamber 40. The mass analyzer 10 is isolated from the high pressure region 36 by a small (approximately 1 mm diameter) aperture 42 positioned so as not to reduce the signal, while providing a pressure sight of several orders of magnitude. The pumping aperture 12 is electronically isolated and can be biased up to approximately 15 kV with respect to the vacuum chamber 34. Biasing of the pumping aperture 12 increases the number of ions that enter the mass analyzer 10, resulting in an increased signal intensity. Increasing the extractor potential from 0.0 V to −8 kV increases the signal intensity by a factor of approximately thirty.

Typical conditions for thin film growth on a sample surface include a low vacuum, high pressure atmosphere in the sample region 36. The operating condition of the ToF SIMS/MSRI reflectron mass analyzer is high vacuum, low pressure. Because of the high energy of the direct recoiled MSRI elemental ions, the ToF SIMS/MSRI reflectron mass analyzer is able to perform MSRI analysis of samples contained in the low vacuum, high pressure environment of the sample region 36 by differentially pumping the sample vacuum chamber 40 and analyzer vacuum chamber 34. When performing SIMS analysis, however, the sample vacuum chamber 40 and analyzer vacuum chamber 34 are not differentially pumped, but rather both chambers are maintained at high vacuum, low pressure conditions, as SIMS analysis is not feasible at high pressures due to the low energy (low velocity) of the SIMS ions. SIMS is therefore used to characterize thin films after the growth phase and before background atmosphere contaminates the sample chamber.

The lens assembly 14 is used to focus the extracted ions. The lens assembly 14 can also be used as an energy filter (i.e., if the extractor potential is 0.0 V and if the potential of the lens is +30 V, then all ions with an energy of +30 V or less will be kept out of the analyzer).

The high voltage float 16 is comprised of a tube and used to provide a field free drift region 18 between the lens assembly 14 and the front ring 22 of the reflectron 20. The front ring 22 is set to the potential of the high voltage float tube 16. Increasing the potential of the high voltage float reduces the time of flight for a given mass and decreases the relative kinetic energy spread between different velocity ions of the same mass. Time refocusing of a small energy spread having a large median energy enables the collection of the entire mass spectrum in a single measurement. For example, to time refocus an energy spread of 0 to 800 eV, the high voltage float can be set to 0 V, the energy of the recoiled species is 0 to 800 eV and the 800 eV energy spread is twice as large as the median value of the recoil energy (400 eV). When the high voltage float is −8 kV, the kinetic energy of the recoiled species is 8 keV to 8.8 keV, and the 800 eV energy spread is more than an order of magnitude smaller than the median energy of 8.4 keV.

The multiple or forty-three ring reflectron 20 is comprised of a series of central rings 24 used to time refocus the ion trajectories. Potentials are applied to both the front ring 22 and the back ring 26. The voltages of the central rings 24 are set via 1 MΩ resistors (not shown) which connect successive rings inside the vacuum chamber 34. Most reflectron analyzers have grids attached to the front and back rings in order to properly terminate the electric fields. However, since the potential of the front ring 22 and the float tube 16 are typically the same for the present analyzer 10, a grid is not needed on the front ring 22. The absence of the front grid has two beneficial effects: the signal throughput is not attenuated and there is no scattering (i.e., change in energy and direction of the primary/ejected species due to collisions with the grid). A back grid 28 is placed on the back ring 26 in order to properly terminate the field.

The ion detector 30 is disposed at the front end of the reflectron 20, in close proximity to the front ring 22, so as to intersect the trajectories of the ions, which are reversed within the reflectron. The ion detector 30 is a dual microchannel plate (MCP) stack. The line-of-sight neutral detector 32 is disposed at the second end of the reflectron, so as to interest the trajectories of the neutral species that travel the length of the reflectron. The line-of-sight neutral detector 32 is a second dual MCP stack. A glass view-port (not shown) is located directly behind the line-of-sight neutral detector 30, such that a laser pointing device can be used (outside of the vacuum system) to accurately position small samples in the region viewed by the reflectron analyzer 10.

Figure 1:
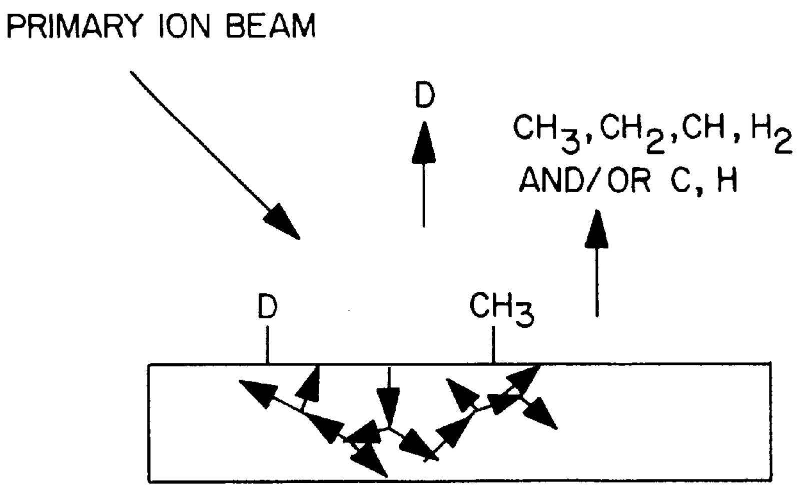
FIG. 1 is a schematic illustration of SIMS.
Figure 2:
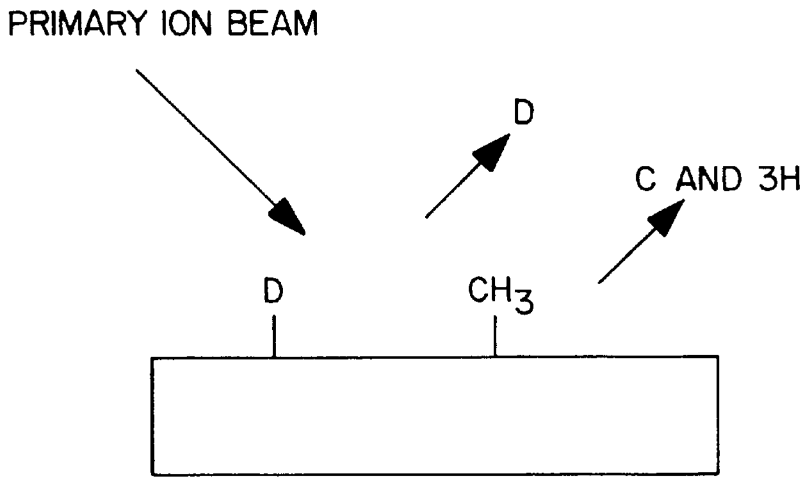
FIG. 2 is a schematic illustration of DRS and MSRI.
Figure 3:
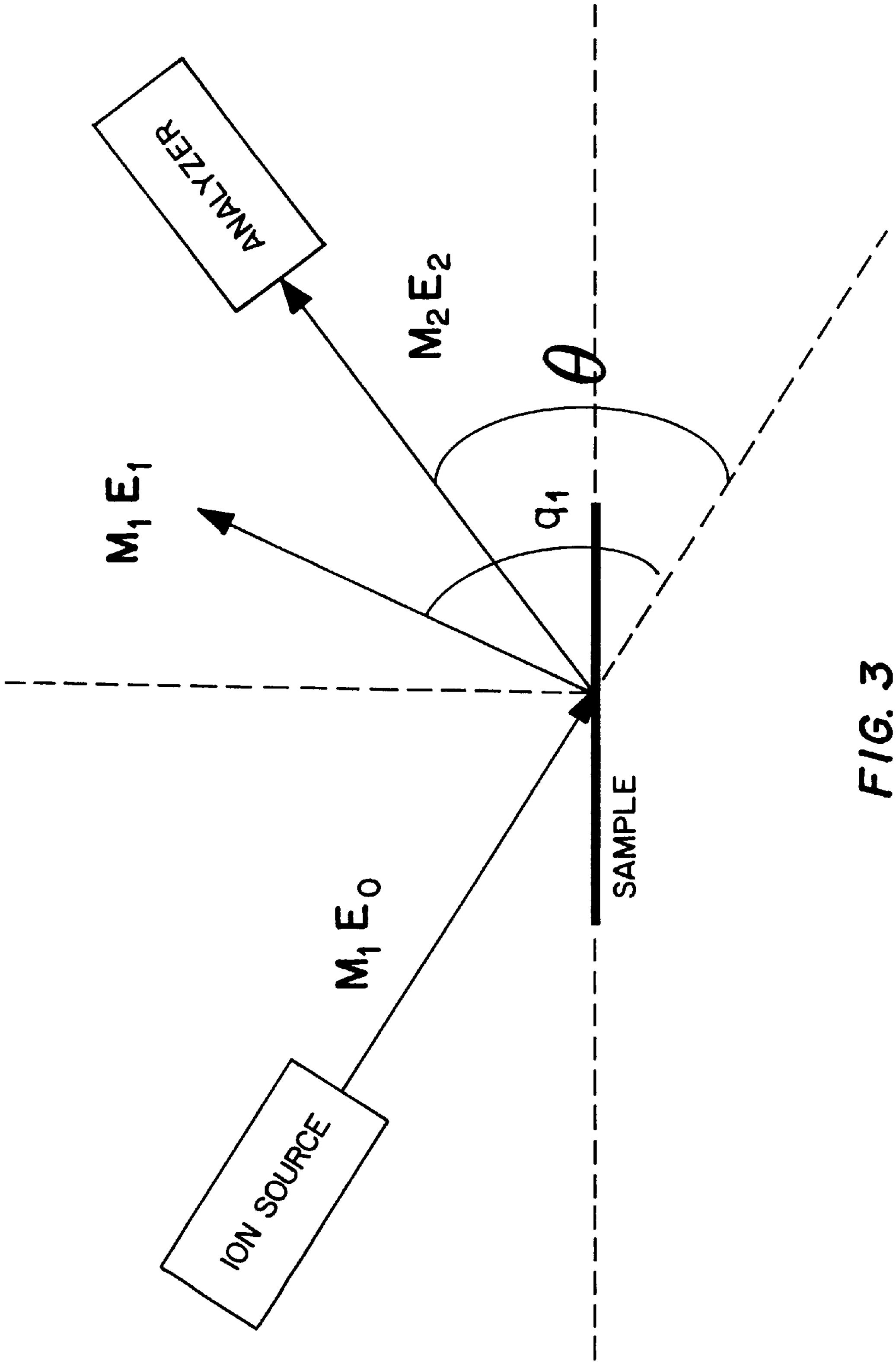
FIG. 3 is a schematic illustration of the critical geometry for positioning the ToF SIMS/MSRI mass analyzer.

In operation, the ToF SIMS/MSRI mass analyzer is positioned at a predetermined angle θ, as shown in FIG. 3 and 4, where θ is the angle between the horizontal axis of the mass analyzer 46 and the undeflected primary ion beam line 48. (The angle between the initial ion beam line 50 from the ion beam source and the horizontal axis 46 of the mass analyzer 10 is 180°−θ). According to the present method, θ is less than or equal to 120° degrees, preferably in the range of between about 5° and about 89°, and more preferably, equal to 74°. Increasing θ results in a greater low energy ion yield (SIMS), as the horizontal axis of the analyzer becomes close to the surface normal. Alternatively, decreasing θ results in a greater high energy yield (MSRI) and a reduced SIMS yield.

Primary ions can be chosen from any element or molecule which can be ionized conveniently either from a gas phase ion source or solid state ion source and can include noble gases and alkali ions, among others. The ion source can be pulsed by a number of standard techniques, so that the primary ion beam impinges the surface for a time duration of between about 1 and about 100 nsec. One technique is to deflect the primary ions by electronically pulsing a deflection plate across a small aperture interposed between the sample and the ion source. The beam energy needs to be in the keV energy range of between about 1 and about 200 keV and is typically around 20 keV.

For positive ion analysis, the back ring of the reflectron is set to greater than about +700V for MSRI measurements and between the range of about +15V and +35V for SIMS measurements. (The back ring voltage for performing MSRI analysis must be greater than $E_2$, the energy of the direct recoil surface species.) Biasing the extractor to a voltage of about 0 V and the lens to about +30 V further removes SIMS species from the mass spectra, forming a low energy ion filter. The low energy ion filter prevents low energy ions (SIMS ions) from entering the reflectron analyzer and provides pure MSRI spectra.

For positive ion analysis, the extractor, lens, and front ring of the reflectron are set at a negative high voltage (−HV). The back ring 24 is used to time refocus the ejected ions and is set at predetermined positive high voltages (+HV), depending upon whether the desired use of the analyzer is for SIMS or MSRI analyses. The back ring must be set at a potential whereby the path of the low or high energy ions is reversed within the reflectron. For example, a back ring potential set at 900 V increases the MSRI ion yield and decreases the SIMS ion yield. At even larger back ring potentials (1.5 kV or greater), the low energy SIMS ions are not effectively time refocused, and the SIMS ion yield falls to zero, resulting in a pure MSRI spectra. Increasing the back ring potential also reduces the number of reflectron rings which are used to time refocus the MSRI ions if the recoil energy is kept constant. In order for the MSRI ions to utilize as much of the reflectron as possible for time refocusing, while eliminating the SIMS contribution, both the back ring potential and the energy of the recoiled species is increased. The recoil energy may be increased by increasing the primary beam energy, increasing the mass of the primary beam, or by increasing θ. Increasing the primary beam energy is the simplest method for increasing the recoil energy and has little effect on the energy of the ejected SIMS ions, since the SIMS ions are generated by the collision cascade process. According to the present method, for SIMS measurements the back ring of the reflectron is preferably set to +30V and for MSRI measurements the back ring of the reflectron is preferably set to +700 V.

The sample surface 44 and the corresponding sample surface normal are adjustable by a positioning means, including a laser pointing device manipulated via the view port (not shown), which is located behind the neutral detector.

Thus, the present method for analyzing the surface characteristics of a sample by SIMS and MSRI includes first positioning the horizontal axis of the ToF SIMS/MSRI reflectron mass analyzer, as described above, at an angle θ with respect to the undeflected primary ion beam line, where θ is less than or equal to 120° degrees, preferably in the range of between about 5° and about 89°, and more preferably, equal to 74°, and applying a negative high voltage to the extractor, lens, and front ring of the reflectron. Next, the method includes applying a positive voltage of between the range of about +15 V and about +50 V, and preferably about +30V, to the back ring of the reflectron, maintaining a low pressure high vacuum atmosphere in both the sample vacuum chamber and the analyzer vacuum chamber, directing a primary ion beam at a sample surface to produce low energy ejected species (SIMS species), including elemental ions and molecular fragments, and extracting low energy species into the ToF SIMS/MSRI reflectron mass analyzer, whereby the low energy ejected species and neutral ejected species are detected at the ion detector and the line-of-sight neutral detector, respectively, resulting in a SIMS mass spectra for the molecular composition of the sample surface.

The method further includes applying a positive voltage of greater than about +700 V to the back ring front ring of the reflectron, differentially pumping the sample vacuum chamber 40 from the analyzer vacuum chamber 34, such that the sample vacuum chamber 40 is maintained at a high pressure, low vacuum, and the analyzer vacuum chamber 34 is maintained at a low pressure, high vacuum, directing a primary ion beam at a sample surface to produce high energy ejected species (MSRI species including elemental ions), and extracting the high energy species into the ToF SIMS/MSRI reflectron mass analyzer, whereby the high energy ejected species and the neutral ejected species are detected at the ion detector and the line-of-sight neutral detector, respectively, resulting in a MSRI mass spectra of the composition of the sample surface. (The times of flight of the detected species are converted to determine the mass spectra of the surface elements and molecules for both the SIMS and MSRI measurements.)

Table 1 below provides the optimum geometry and potentials for positive ion analysis using the ToF SIMS/MSRI reflectron mass analyzer, where HV is high voltage.

TABLE 1

| | MSRI | SIMS |
|---|---|---|
| Extractor | −HV | −HV |
| Lens | −HV | −HV |
| Float/Front Ring | −HV | −HV |
| Back Ring | +700 V | +30 V |
| θ (degrees) | 74 | 74 |

Negative ion analysis is performed by inverting the polarities of the extractor, lens, float/front ring, and back ring.

EXAMPLES

Figure 8:
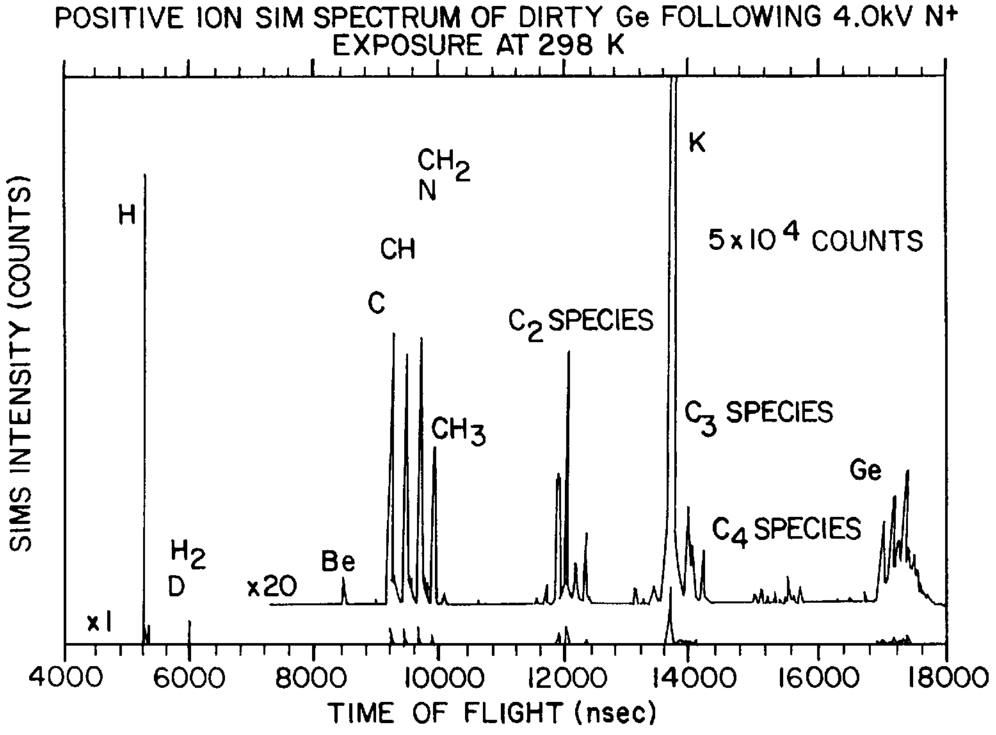
FIG. 8 shows a positive ion SIM spectrum of a Ge sample having surface contaminants, following a 4.0 keV $N^+$ ion beam exposure at 298 K, which was obtained immediately after the MSRI spectrum shown in FIG. 5.

The parameters used for positive ion MSRI data collection shown in FIG. 5 and the SIMS data collection as shown in FIG. 8, are listed below in Table 2.

TABLE 2

| Parameter | MSRI | SIMS |
|---|---|---|
| Angle θ (degrees) | 74 | 74 |
| Extractor Voltage (V) | −8000 | −8000 |
| Lens Voltage (V) | −8000 | −8000 |
| High Voltage Float (V) | −8000 | −8000 |
| Back Ring Voltage | +1500 | +50 |
| $T_0$ (nsec) | 3711.90 | 3732.36 |
| k | 1416.23 | 1600.46 |

$T_0$ and k, as listed in the above table, are constants required to convert the ToF of a detected species to the mass of the species, according to the equation $$T = To + k(\sqrt{m/e})$$

where m/e is the charge to mass ratio of the detected species.

Figure 5:
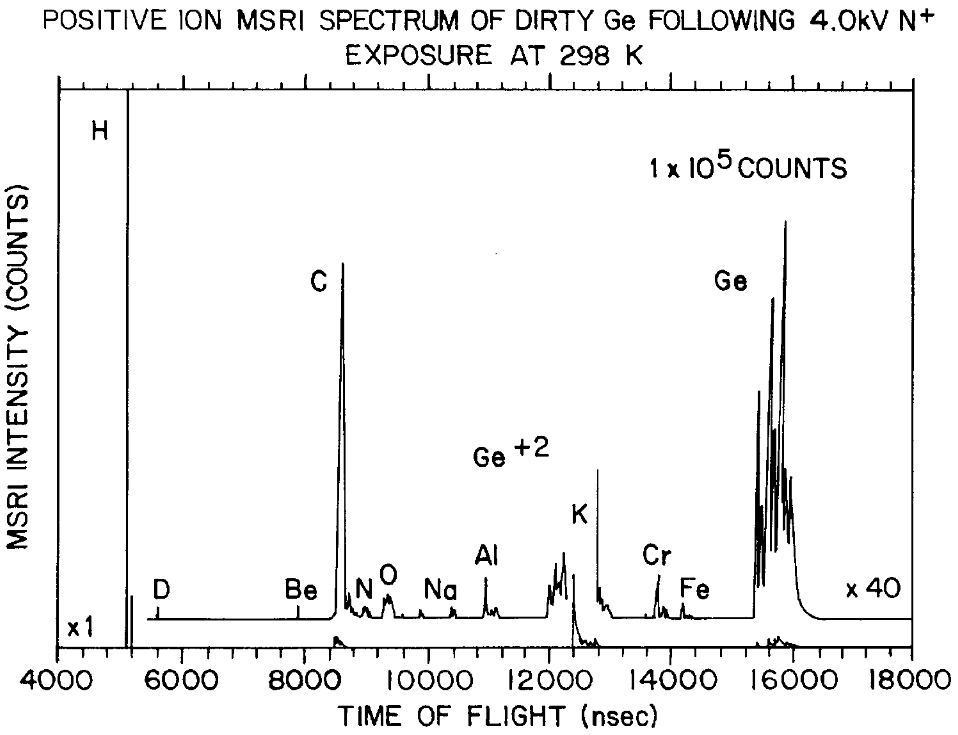
FIG. 5 shows the positive ion MSRI spectrum of a Ge sample having surface contaminants, following a 4.0 keV $N^+$ ion beam exposure at 298 K.

FIG. 5 shows a positive ion MSRI spectrum obtained from a Ge sample having a contaminated surface, following exposure to a 4.0 keV $N^+$ ion beam at 298 K. The mass spectra reveals that in addition to Ge, species such as H, D, Be, C, N, O, Na, Al, Cr, and Fe are also present on the Ge surface. The Na signal results from a Na impurity in the alkali ion source. Significantly, molecular species, such as $CH_4$, and cracking fragments, such as $CH_3$, $CH_2$, and CH, are absent, and, therefore, the elemental ions are easily identified by the features, or peaks, in the graph. For example, the positive assignment of the element having a flight time of 9100 nsec (14 amu) is nitrogen (N). The unlabeled features at flight times of 5300 nsec and 8900 nsec correspond to surface H ($^{41}K^+$) and surface C ($^{41}K^+$), respectively.

Figure 6:
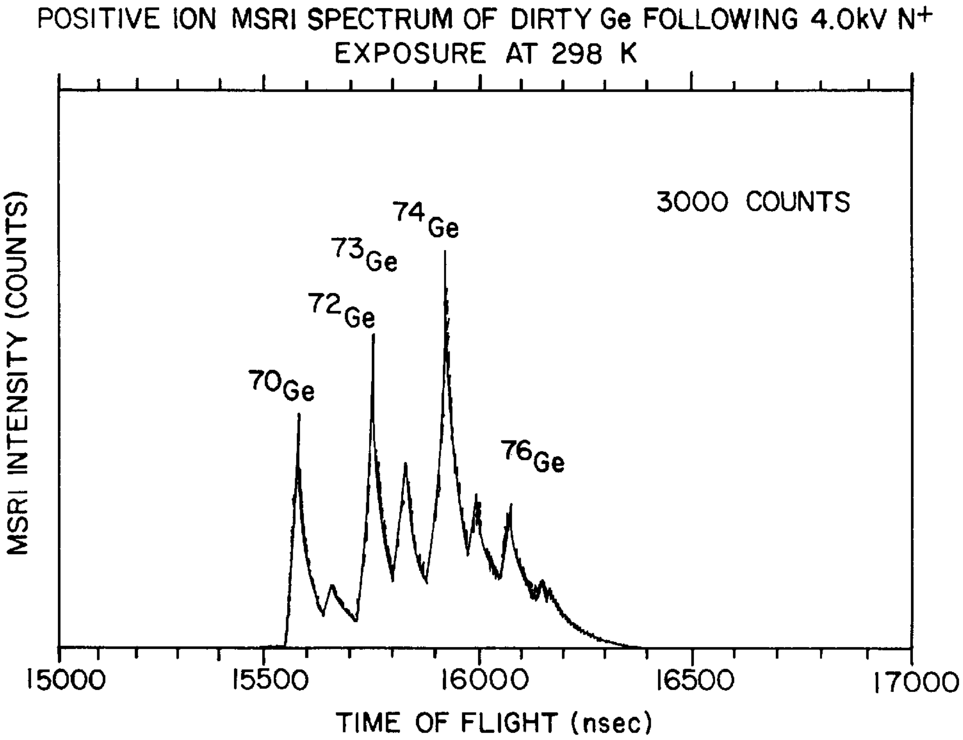
FIG. 6 shows an enlarged section of the Ge isotope region of FIG. 5.

FIG. 6 shows an enlarged section of FIG. 5, for times of flight in the range of 15000 to 17000. Each of five Ge isotopes are easily distinguishable. The relative intensities of the Ge isotopes are 0.59 for $^{70}$Ge, 0.79 for $^{72}$Ge, 0.19 for $^{73}$Ge, 1.0 for $^{74}$Ge, and 0.19 for $^{76}$Ge. Unlabeled features in FIG. 6 at flight times of 15650 nsec, 15980 nsec, and 16140 nsec are germanium isotopes resulting from $^{41}K^+$ in the primary ion beam. The feature time of 15280 nsec contains contributions from both $^{73}$Ge+($^{39}K^+$), the dominant species, and $^{72}$Ge+($^{41}K^+$), the minor species.

Figure 7:
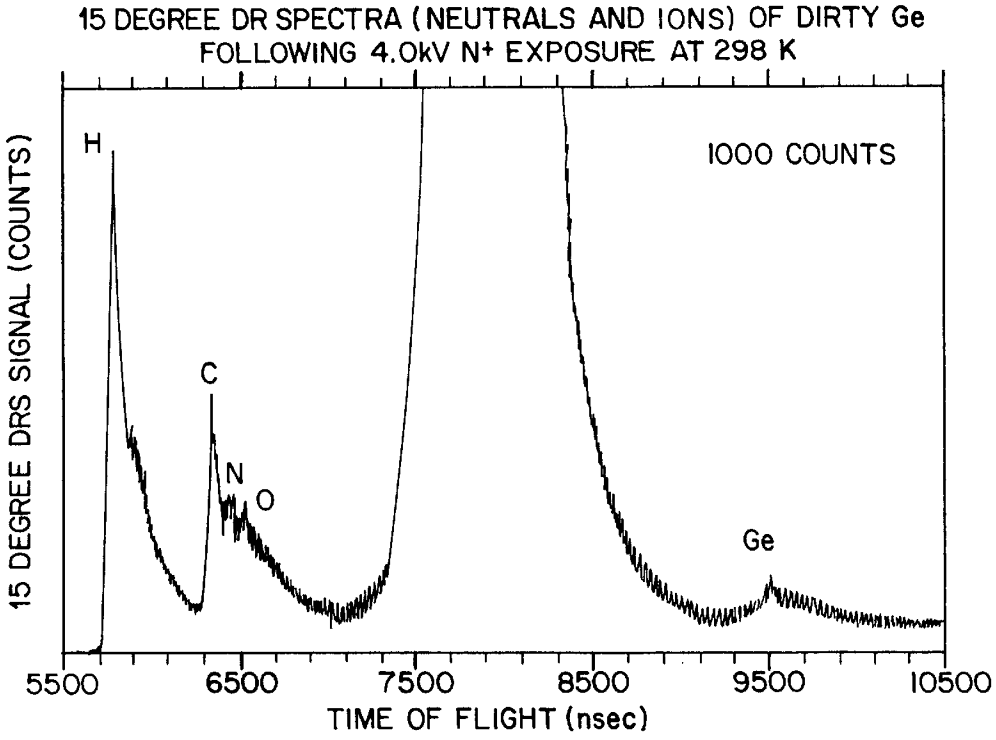
FIG. 7 shows a DRS spectrum of a Ge sample having surface contaminants, following a 4.0 keV $N^+$ ion beam exposure at 298 K, which was obtained simultaneously with the MSRI spectrum shown in FIGS. 5 and 6.

FIG. 7 shows a direct recoil spectrum (DRS), which includes elemental ions and neutrals, obtained using a linear ToF analyzer at an angle of 15 degrees between the horizontal axis of the analyzer and the incoming incident ion beam. The DRS spectrum shown in FIG. 7 was obtained simultaneously with the MSRI spectrum shown in FIG. 5. A comparison of FIGS. 5 and 7 illustrates the great improvement in resolution of MSRI over DRS. In FIG. 7, species such as H, C, N, and O are easily detected, however, species present in trace amounts, such as Be, Na, Al, Cr, and Fe, are buried in the long tails of the dominating species.

A further comparison of FIGS. 5 and 7 illustrates that the yield of the H MSRI feature is much greater than the yield of the H DRS feature. For the MSRI data shown in FIG. 5, the ionic species are extracted into the reflectron analyzer with a potential of −8 kV. For the DRS spectrum shown in FIG. 7, the field free drift region between the sample and the detectors is 0 V, and since the recoiled species are not extracted, the H DRS yield is significantly lower than the H MSRI yield.

Although the resolution of MSRI is significantly greater than the resolution of DRS, the MSRI is only detecting the ion fraction and not the neutral fraction. However, to perform absolute quantitative analysis, accurately measuring the true surface concentrations, the neutral fraction must be included. The line-of-sight neutral detector 32, located at the end of the reflectron analyzer, measures either the ion recoil intensity plus the neutral recoil intensity ($I_i$+$I_n$), when all of the reflectron analyzer potentials are set to ground potential (MSRI analysis disabled), or the line-of-sight neutral detector measures the neutral recoil intensity only ($I_n$), when the reflectron analyzer is biased to perform MSRI analysis. Subtracting the two spectra provides the ion only direct recoil intensity ($I_i$), and, thus, the direct recoil ion fraction, $I_i/(I_i+I_n)$ is determined. The fraction, calculated from the direct recoil spectra using the same geometry, is further used to convert the MSRI ion yield to true absolute surface concentration.

FIG. 8 shows a positive ion SIM spectrum of the Ge surface having surface contaminants following a 4.0 keV $N^+$ ion beam incidence at 298 K. This spectrum was obtained using the conditions reported in Table 2, above. In addition to elemental ions, molecular ions and molecular fragments were observed, complicating data analysis and broadening some of the peaks. The peak at a flight time of 9725 nsec (14 amu) contains contributions from both N and $CH_2$, illustrating that SIMS analysis of nitrogen is not as direct as MSRI analysis.

The SIM spectrum shown in FIG. 8 was obtained immediately after the MSRI spectrum shown in FIG. 5, to allow for an accurate comparison of MSRI and SIMS data collected from an identical sample using the ToF SIMS/MSRI reflectron mass analyzer shown in FIG. 4. Since the feature at a mass of 9 amu can only be assigned to Be, the intensity of the Be feature can be used as a measure of the sensitivity of MSRI and SIMS. The Be intensities are 443 counts for the MSRI spectrum shown in FIG. 5 and 560 counts for the SIM spectrum of FIG. 8, indicating that the sensitivity of both MSRI and SIMS is essentially the same.

The resolution (R) of the spectral features is given by: R=M/ΔM, where M is the mass of the spectral feature being analyzed, and ΔM is the full width at half maximum intensity of the spectral feature being analyzed. Table 3 below lists values of M, ΔM, and R for various features in the MSRI and SIM spectra.

TABLE 3

| Assignment | Technique | Mass | ΔM | R |
|---|---|---|---|---|
| H | MSRI | 1 | 0.0124 | 80.4 |
| H | SIMS | 1 | 0.0159 | 62.9 |
| $^{70}$Ge | MSRI | 70 | 0.3139 | 223 |
| $^{70}$Ge | SIMS | 70 | 0.7446 | 93.3 |
| $^{72}$Ge | MSRI | 72 | 0.3445 | 209 |
| $^{72}$Ge | SIMS | 72 | 0.7898 | 93.7 |

Table 3 shows that the resolution of MSRI is slightly better than the resolution of SIMS for masses where only one species is contributing to the SIMS signal, such as H with 1 amu. For MSRI, the resolution of the Ge isotopes is more than twice the resolution obtained using SIMS. The degraded SIMS resolution arises from the presence of multiple species at a given mass. For example, 72 amu corresponds to $^{72}Ge^+$, $^{70}GeH_2^+$, $C_5H_{12}^+$, and/or $C_4H_8O^+$.

Importantly, the resolution (R) values reported above were obtained using the reflectron voltages provided in Table 2, which allow for the analysis of the mass range from H (1 amu) to Pb (207 amu), with isotopic resolution. The resolution can be increased significantly if the reflectron voltages are set to allow the transmission of a smaller energy (mass) window.

In DRS and MSRI, the violence of the binary collision results in complete fragmentation of the molecular species. Only elemental ions appear in the DRS/MSRI spectra. The elemental MSRI spectrum shown in FIG. 5 clearly reveals the presence of N on the Ge surface. A major advantage of MSRI is that the MSRI ion yield varies by a factor of 10 or less, as the surface composition changes, and, therefore, the MSRI ion yield provides precise information for surface concentrations. In SIMS, the ions are ejected from the surface with low velocity, and the probability of ion survival varies by orders of magnitude depending on the element being ejected and the oxidation state of the surface. Thus, accurate determinations of both the ion yield and the neutral yield are complicated. For example, the SIM spectrum shown in FIG. 8 contains elemental ions, molecular ions, as well as molecular fragments, which result in mass overlap and hinders detection of minority species, such as N (especially in the presence of hydrocarbons which produce a significant $CH_2^+$ signal at 14 amu). Although the elemental MSRI spectra are easy to interpret, MSRI does not permit the analysis of the actual molecular species present on the surface. The SIM spectrum of FIG. 8 illustrates that the large C signal observed in MSRI results from hydrocarbon species with up to 4 carbon atoms. The data of FIGS. 5 and 8 clearly demonstrate that MSRI and SIMS provide complimentary information. Importantly, with the present method and apparatus, a single analyzer is used to perform both types of measurements.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiments described explain the principles of the invention and practical applications and should enable others skilled in the art to utilize the invention in various embodiments and with various modifications as are suited to the particular use contemplated. While the invention has been described with reference to details of the illustrated embodiment, these details are not intended to limit the scope of the invention, rather the scope of the invention is to be defined by the claims appended hereto.

The embodiments of the invention in which an exclusive property or privilege is claimed are defined as follows:

1. A method for measuring low and high energy ejected species from a sample by using a single time-of-flight reflectron mass analyzer to provide complimentary qualitative and quantitative surface information about the sample, comprising:

providing an ion source for generating a beam of primary ions along a primary beam line;

providing a time-of-flight reflectron mass analyzer having a horizontal axis and being comprised of an extractor, a lens assembly, a field-free float tube, and a reflectron having a front ring and a back ring;

containing the analyzer in an analyzer vacuum chamber;

maintaining the atmosphere of the analyzer vacuum chamber at a predetermined vacuum and a predetermined pressure;

positioning the sample having a surface for analysis within a sample vacuum chamber, the sample vacuum chamber being in communication with the analyzer vacuum chambers and the sample surface being in close proximity to the analyzer extractor and intersecting the primary beam line, thereby defining segments of the primary beam line as an initial primary beam line between the ion source and the sample surface and an undeflected primary beam line extending beyond the sample surface;

maintaining the atmosphere of the sample vacuum chamber at a predetermined vacuum and a predetermined pressure;

positioning the horizontal axis of the time-of-flight reflectron mass analyzer at an angle of less than 90 degrees from the surface normal and at an angle θ of less than about 120 degrees from the undeflected primary beam line;

applying a specific negative high voltage to the extractor, the lens assembly, the field-free float tube, and the front ring of the refectron;

performing SIMS analysis by applying a positive high voltage of between the range of about +15V and +50 V to the back ring, generating a beam of primary ions alone the primary beam line, thereby causing a collision cascade in the sample surface such that elemental and molecular sample surface species are ejected including a positive ion fraction and a neutral species fraction, and measuring the times of flight of the positive ion fraction at an ion detector and the times of flight of the neutral species fraction at a line-of-sight neutral detector to obtain a SIM spectra;

performing a MSRI analysis by applying a positive high voltage of greater than about +500 V to the back ring, generating a beam of primary ions along the primary beam line, thereby causing a binary collision between the primary ions and sample surface species such that elemental surface species are ejected including a positive ion fraction and a neutral species fraction, and measuring the times of flight of the positive ion fraction at the ion detector and the times of flight of the neutral species fraction at the line-of-sight neutral detector to obtain a MSRI spectra; and determining the mass of the sample surface species from the measured times of flight.

2. The method according to claim 1, wherein the MSRI analysis is performed prior to the SIMS analysis.

3. The method according to claim 1, wherein the angle θ is in the range of between about 5 degrees and about 89 degrees.

4. The method according to claim 1, wherein the angle θ is in the range of between about 20 degrees and about 80 degrees.

5. The method according to claim 1, wherein the angle θ is equal to 74 degrees.

6. The method according to claim 1, wherein the step of performing the SIMS analysis includes applying a positive high voltage of about +30V to the back ring of the reflectron.

7. The method according to claim 1, wherein the step of performing the MSRI analysis includes applying a positive high voltage of about +700V to the back ring of the reflectron.

8. The method according to claim 1, wherein the step of performing the MSRI analysis includes applying a positive high voltage to the back ring of the reflectron of greater than 1.5 kV, whereby only deflected primary ions and ejected elemental species resulting from binary collisions are detected.

9. The method according to claim 1, wherein the negative high voltage applied to the extractor, the lens assembly, the field free float, and the front ring of the reflectron is −8000 V.

10. The method according to claim 1, wherein the step of performing the SIMS analysis includes maintaining the atmospheres of the analyzer vacuum chamber and the sample vacuum chamber at a high vacuum and a low pressure.

11. The method according to claim 1, wherein the step of performing the MSRI analysis includes maintaining the atmospheres of the analyzer vacuum chamber and the sample vacuum chamber at a high vacuum and a low pressure.

12. The method according to claim 1, wherein the step of performing the MSRI analysis includes differentially pumping the analyzer vacuum chamber and the sample vacuum chamber, thereby maintaining the atmosphere of the analyzer vacuum chamber at a high vacuum and a low pressure, and maintaining the atmosphere of the sample vacuum chamber at a low vacuum and a high pressure.

13. The method according to claim 1, further comprising the steps of providing a view port along the horizontal axis of the analyzers and disposing a laser pointing device at the view port for positioning the sample.

14. The method according to claim 1, further comprising the steps of:

performing a second MSRI analysis by applying zero voltage to the extractor, the lens assembly, the field-free float tube, and the front and back rings of the reflectron, generating a beam of primary ions alone the primary beam line, thereby causing a binary collision between the primary ions and sample surface species such that elemental surface species are ejected including a positive ion fraction and a neutral species fraction, and measuring the ion fraction and the neutral species fraction of ejected surface species at the line-of-sight detector only to obtain a second MSRI spectra;

subtracting the initial MSRI spectra from the second MSRI spectra to obtain an ion fraction only spectra; and calculating the absolute surface concentration of the sample by determining the ratio of the ion fraction only spectra to the ion fraction and neutral species fraction spectra obtained by the second MSRI analysis.

15. The method according to claim 1, further comprising the steps of performing the SIMS and MSRI analyses by reversing the polarity of the specific negative high voltage applied to the extractor, the lens assembly, the field-free float tube, and the front ring of the reflectron, and reversing the polarity of the positive high voltage applied to the back ring, whereby a negative ion fraction and a neutral species fraction of the ejected surface species are measured by the detectors.

16. A ToF reflectron mass analyzer for performing MSRI and SIMS analysis of a sample surface, comprising:

an extractor having a first end and a second end, the first end having an aperture for extracting species into the analyzer;

a focusing means for focusing the extracted species, said focusing means having a first end and a second end, the first end of said focusing means being connected to the second end of said extractor;

a field-free float tube having a first end, a second end, and a horizontal axis, the first end of said field-free float tube being connected to the second end of said focusing means, whereby extracted species traverse said field-free float tube;

a reflectron mass separating means having a first end and a second end, the first end of said reflectron mass separating means being connected to the second end of said field-free float tube, said reflectron mass separating means further having a front ring and a back ring, whereby the extracted species are separated according to mass;

an ion detector for detecting extracted species separated by said reflectron mass separating means;

a neutral detector for detecting extracted neutral species;

a vacuum chamber containing said extractor, said focusing means, said field-free float tube, said reflectron mass separating means, and said detectors;

an ion source for generating a beam of primary ions along a primary beam line that intersects the sample surface, thereby defining segments of the primary beam line as an initial primary beam line between said ion source and the sample surface, and an undeflected primary beam line beyond the sample surface, such that an angle between the sample surface normal and the horizontal axis of said field-free float tube is less than 90 decrees and an angle θ between the undeflected primary beam line and the horizontal axis of said field-free float tube is less than or equal to about 120 degrees; and means for adjusting the voltage of the back ring of said reflectron mass separating means, whereby SIMS analysis is performed successively with MSRI analysis.

17. The ToF reflectron mass analyzer according to claim 16, wherein the angle θ is in the range of between about 5 degrees and about 89 degrees.

18. The ToF reflectron mass analyzer according to claim 16, wherein the angle θ is in the range of between about 20 degrees and about 80 degrees.

19. The ToF reflectron mass analyzer according to claim 16, wherein the angle θ is equal to 74 degrees.

20. The ToF reflectron mass analyzer according to claim 16, wherein said reflectron mass separating means is a reflectron having at least one intermediate ring between the front ring and the back ring.

21. The ToF reflectron mass analyzer according to claim 16, wherein the back ring of said reflectron mass separating means has a positive applied voltage, and said extractor, said focusing means, said field-free float tube, and the front ring of said reflectron mass analyzer separating means have negative applied voltages.

22. The ToF reflectron mass analyzer according to claim 16, wherein the back ring of said reflectron mass separating means has a negative applied voltage, and said extractor, said focusing means, said field-free float tube, and the front ring of said reflectron mass analyzer separating means have positive applied voltages.

23. The ToF reflectron mass analyzer according to claim 16, wherein said vacuum chamber has a high vacuum, low pressure atmosphere.

* * * * *